US010123446B1

(12) United States Patent
Hou et al.

(10) Patent No.: US 10,123,446 B1
(45) Date of Patent: Nov. 6, 2018

(54) SERVER DEVICE

(71) Applicant: GIGA-BYTE TECHNOLOGY CO.,LTD., New Taipei (TW)

(72) Inventors: Chih-Jen Hou, New Taipei (TW); Ching-Chuan Huang, New Taipei (TW); Chin-Han Tsai, New Taipei (TW); Chao-Hsiang Huang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/721,330

(22) Filed: Sep. 29, 2017

(30) Foreign Application Priority Data

Jun. 22, 2017 (TW) .............................. 106120925 A

(51) Int. Cl.
*H05K 7/14* (2006.01)
*H05K 5/00* (2006.01)

(52) U.S. Cl.
CPC ......... *H05K 7/1489* (2013.01); *H05K 5/0021* (2013.01); *H05K 7/1487* (2013.01)

(58) Field of Classification Search
None
See application file for complete search history.

(56) References Cited

U.S. PATENT DOCUMENTS

| 2006/0136622 A1* | 6/2006 | Rouvelin | H05K 5/0021 |
| | | | 710/62 |
| 2007/0233781 A1* | 10/2007 | Starr | G11B 33/126 |
| | | | 709/203 |
| 2008/0239648 A1* | 10/2008 | Okamoto | G06F 1/183 |
| | | | 361/725 |
| 2010/0172083 A1* | 7/2010 | Randall | G11B 33/126 |
| | | | 361/679.31 |
| 2011/0007464 A1* | 1/2011 | Leigh | H01R 9/2408 |
| | | | 361/679.01 |
| 2014/0144858 A1 | 5/2014 | Yokosawa et al. | |

(Continued)

FOREIGN PATENT DOCUMENTS

| CN | 105630098 A | 6/2016 |
| TW | 201501625 A | 1/2015 |

OTHER PUBLICATIONS

TW Office Action filed in application No. 106120925, dated Jan. 17, 2018.

*Primary Examiner* — Xanthia C Cunningham
(74) *Attorney, Agent, or Firm* — Maschoff Brennan

(57) ABSTRACT

A server device includes a chassis and at least one server assembly. The chassis has at least one accommodating space, at least one first surface, at least one second surface, at least one opening and at least one front side. The first surface and the second surface face each other, and respectively located at two opposite sides of the accommodating space. The opening is located at the front side and connected to the accommodating space. The server assembly is slidably disposed in the accommodating space from the opening. The server assembly includes a first server and a second server. The first server is closer to the first surface than the second server. The first surface and the front side are orthogonal to a reference plane. An orthogonal projection of the first server on the reference plane partially overlaps an orthogonal projection of the second server on the reference plane.

14 Claims, 6 Drawing Sheets

(56) References Cited

U.S. PATENT DOCUMENTS

| | | | |
|---|---|---|---|
| 2014/0307386 A1* | 10/2014 | French, Jr. | G06F 1/16 |
| | | | 361/679.58 |
| 2014/0334084 A1 | 11/2014 | Fricker | |
| 2015/0138716 A1* | 5/2015 | Herman | G06F 1/181 |
| | | | 361/679.32 |
| 2015/0181748 A1* | 6/2015 | Bailey | H05K 7/1488 |
| | | | 361/679.58 |
| 2015/0282375 A1* | 10/2015 | Kao | H05K 7/1487 |
| | | | 312/223.6 |
| 2016/0150668 A1 | 5/2016 | Cheng et al. | |
| 2016/0165742 A1* | 6/2016 | Shen | H05K 7/1487 |
| | | | 361/679.37 |
| 2016/0205803 A1* | 7/2016 | Zhu | H05K 7/1489 |
| | | | 361/679.02 |
| 2016/0219747 A1* | 7/2016 | Genest | H05K 7/1487 |
| 2016/0219748 A1* | 7/2016 | Tsai | H05K 7/1489 |
| 2016/0316585 A1* | 10/2016 | Lu | H05K 7/1489 |
| 2017/0020023 A1* | 1/2017 | Yu | H05K 7/1489 |
| 2017/0055362 A1 | 2/2017 | Bailey et al. | |
| 2017/0064859 A1* | 3/2017 | Chen | H05K 7/1488 |
| 2017/0094827 A1* | 3/2017 | Wilson | H05K 7/1489 |
| 2017/0290191 A1* | 10/2017 | Rivnay | H05K 7/1487 |

* cited by examiner

SERVER DEVICE

CROSS-REFERENCE TO RELATED APPLICATIONS

This non-provisional application claims priority under 35 U. S. C. § 119(a) on Patent Application No(s). 106120925 filed in Taiwan on Jun. 22, 2017, the entire contents of which are hereby incorporated by reference.

TECHNICAL FIELD

The disclosure relates to a server device, more particularly to a multi-node server.

BACKGROUND

With rapid development of technology, computers, such as desk-top computers and notebook computers, are essential for enterprises and individuals. In addition, with the development of the communication technology, E-commerce (electronic commerce) has become more widespread. However, personal computers do not have enough abilities to satisfy the requirements of transnational business activities, and thus a variety of servers are developed for businesses.

In a restricted height of the server rack, developers would stack the most possible amount of servers in the server rack in order to enhance the overall performance of the servers. To achieve convenient maintenance of the servers, the servers are drawably disposed in the server rack. To prevent the electronic components from interfering with each other during the insertion or the drawing out of the servers, the servers are usually spaced apart in a distance according to the most protruding electronic component thereon.

SUMMARY

One embodiment of the disclosure provides a server device including a chassis, at least one server assembly, at least one surface, at least one opening and at least one front side. The at least one first surface and at least one second surface face each other and are respectively located at two opposite sides of the at least one accommodating space. The at least one server assembly is slidably disposed in the at least one accommodating space via the at least one opening. The at least one server assembly includes a first server and a second server. The first server is closer to the first surface than the second server. Both the at least one first surface and the front side are orthogonal to a reference plane. The orthogonal projection of the first server on the reference plane partially overlaps the orthogonal projection of the second server on the reference plane.

BRIEF DESCRIPTION OF THE DRAWINGS

The present disclosure will become more fully understood from the detailed description given here in below and the accompanying drawings which are given by way of illustration only and thus are not intending to limit the present disclosure and wherein.

DETAILED DESCRIPTION

Figure 1:
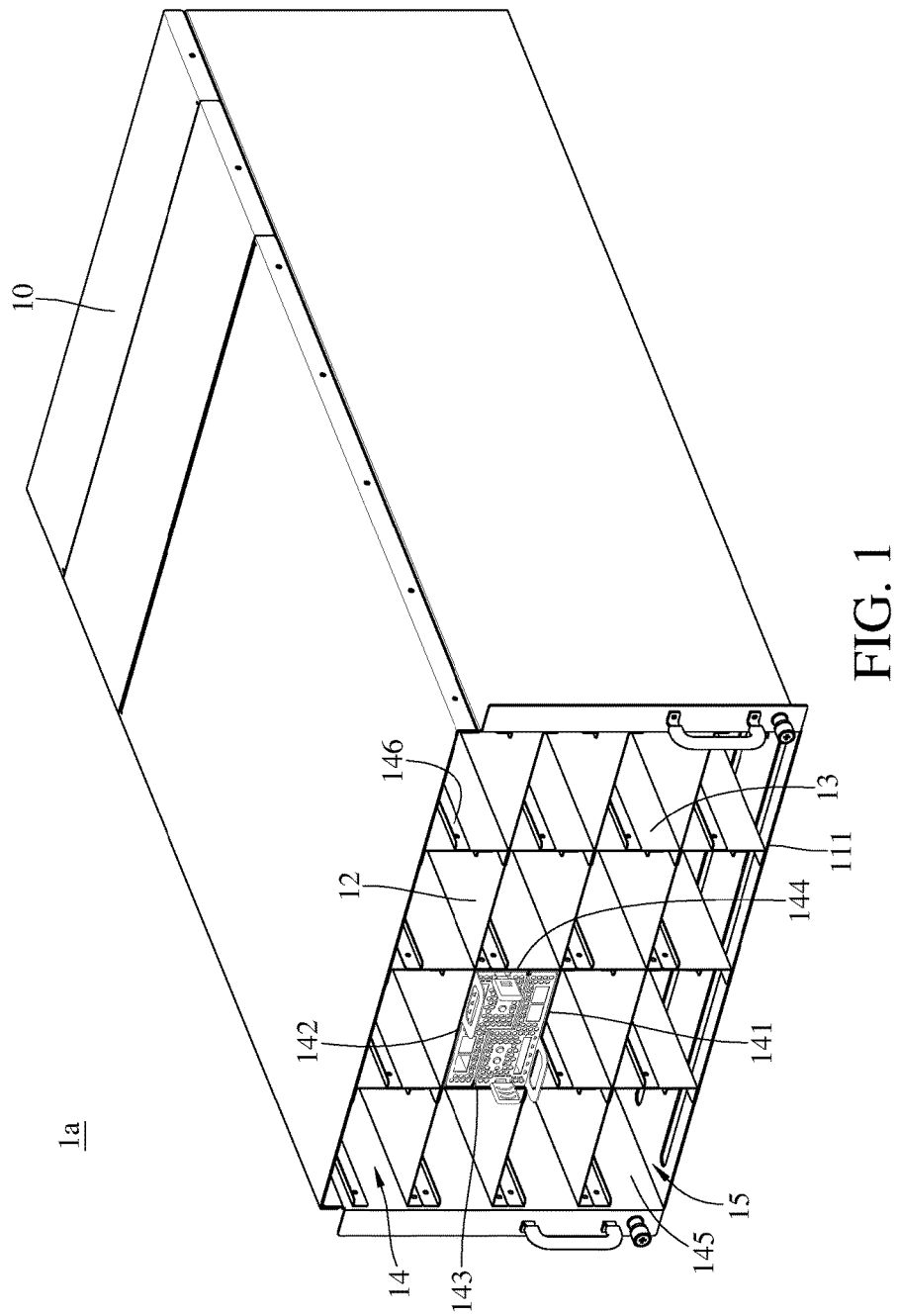
FIG. 1 is a perspective view of a server device in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
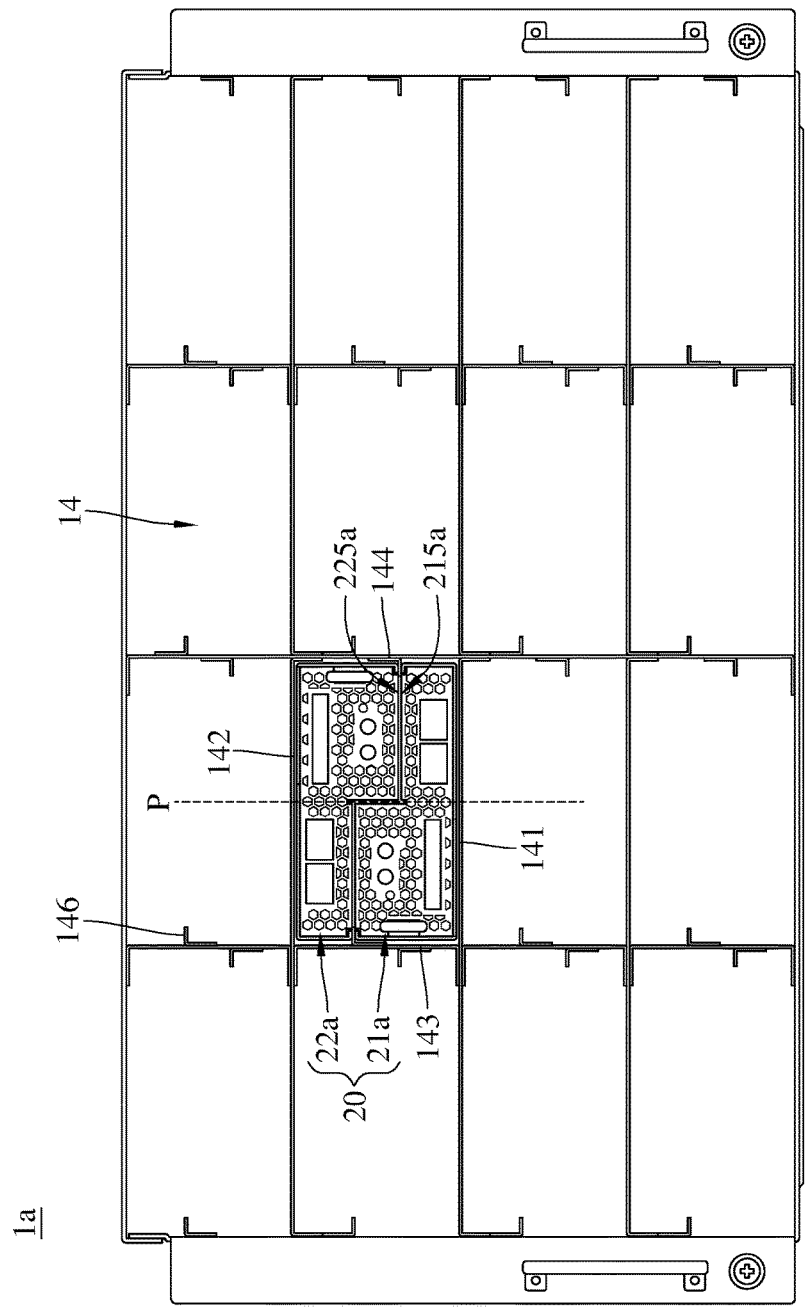
FIG. 2 is a front view of the server device in FIG. 1.
Figure 3:
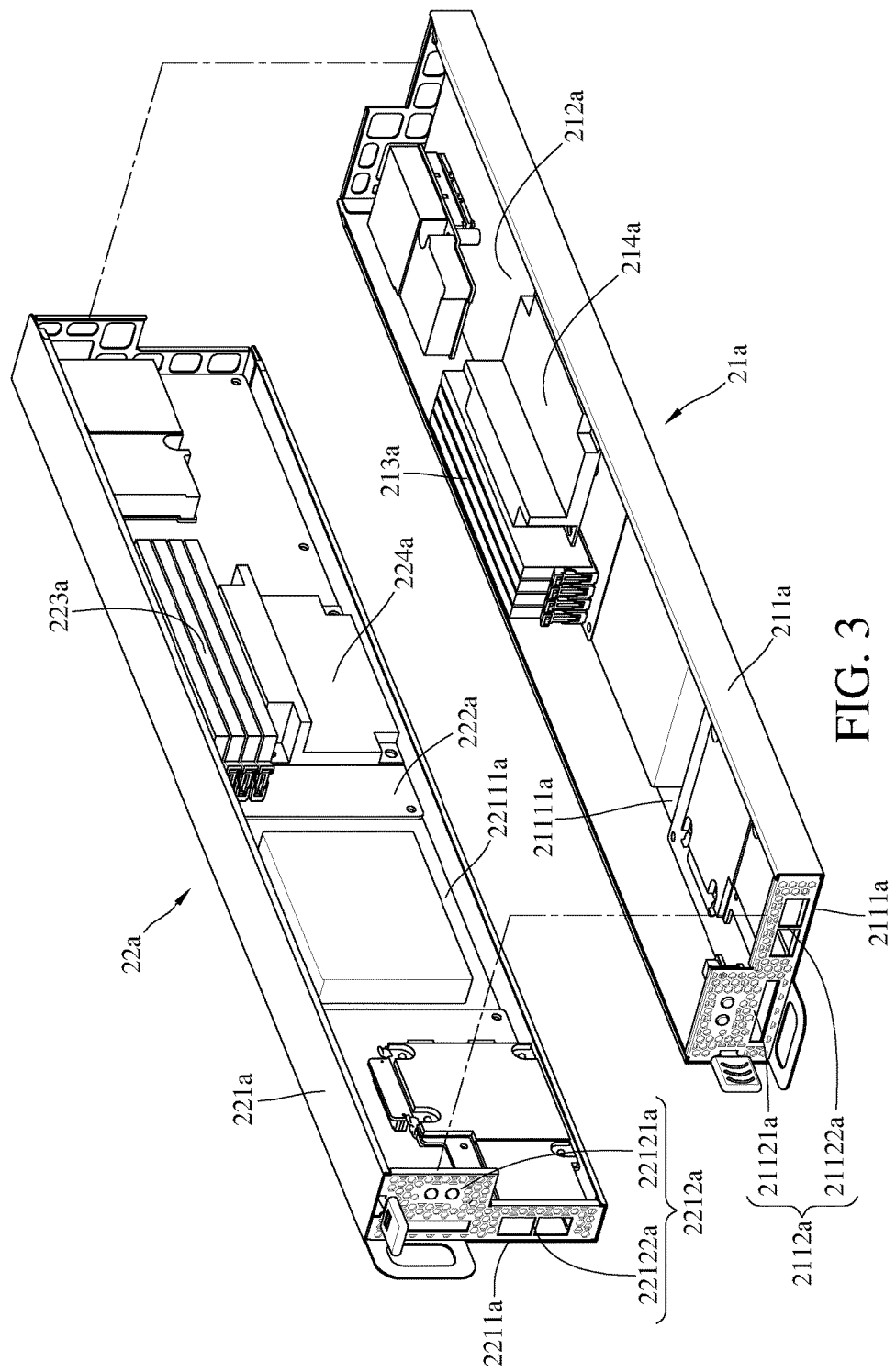
FIG. 3 is an exploded view of a server assembly of the server device in FIG. 1.

Please refer to FIG. 1 to FIG. 3. FIG. 1 is a perspective view of a server device in accordance with one embodiment of the disclosure. FIG. 2 is a front view of the server device in FIG. 1. FIG. 3 is an exploded view of a server assembly of the server device in FIG. 1. A server device 1a includes a chassis 10 and a server assembly 20. For the purpose of clearly illustrating, there is only one server assembly 20 in the figures, but in reality the chassis 10 is able to accommodate more than one server assembly 20.

The chassis 10 includes a main body 11, a plurality of horizontal partitions 12 and a plurality of vertical partitions 13. It is understood that the terms "horizontal" and "vertical" are taken from the viewpoint of the figures and used for clearly description. The main body 11 has a bottom surface 111 and a main space. These horizontal partitions 12 and vertical partitions 13 are located in the main space, and the main space is divided into a plurality of accommodating spaces 14 by the horizontal partitions 12 and the vertical partitions 13. In addition, the chassis 10 has openings 15 respectively connected to the accommodating spaces 14.

For clearly illustrating, only one of the accommodating spaces 14 will be described. The accommodating space 14 is surrounded by a first surface 141, a second surface 142, a third surface 143 and a fourth surface 144. The first surface 141 and the second surface 142 face each other and are respectively located at two opposite sides of the accommodating space 14. The third surface 143 and the fourth surface 144 face each other and are respectively located at another two opposite sides of the accommodating space 14. The third surface 143 and the fourth surface 144 are located between the first surface 141 and the second surface 142. The first surface 141 is parallel to the bottom surface 111. Two rails 146 are respectively located on the third surface 143 and the fourth surface 144. The accommodating space 14 has a front side 145 located at the opening 15. In this embodiment, a distance between one of the rails 146 and the first surface 141 is different from a distance between the other rail 146 and the first surface 141.

The server assembly 20 includes a first server 21a and a second server 22a. The first server 21a and the second server 22a both are slidably disposed in the accommodating space 14 via the opening 15. The first server 21a is closer to the first surface 141 than the second server 22a. For example, the first server 21a is stacked on the first surface 141, and the second server 22a is stacked on the first server 21a.

The first server 21a includes a tray 211a, a circuit board 212a, a first electronic component 213a and a second electronic component 214a. The tray 211a includes a bottom plate 2111a and a front plate 2112a. The front plate 2112a includes a first portion 21121a and a second portion 21122a. The first portion 21121a and the second portion 21122a are both connected to the bottom plate 2111a. The bottom plate 2111a of the tray 211a of the first server 21a is stacked on the first surface 141, and has a supporting surface 21111a facing away from the first surface 141. The circuit board 212a of the first server 21a is disposed on the supporting surface 21111a of the bottom plate 2111a. The first electronic component 213a and the second electronic component 214a of the first server 21a are disposed on the circuit board 212a. The first electronic component 213a of the first server 21a protrudes from the circuit board 212a further than the second electronic component 214a of the first server 21a.

The first portion 21121a protrudes from the bottom plate 2111a further than the second portion 21122a. The first portion 21121a corresponds to the first electronic component 213a, and the second portion 21122a corresponds to the second electronic component 214a. Specifically, the size of the first portion 21121a sticking out from the bottom plate 2111a is similar to the size of the first electronic component 213a sticking out from the bottom plate 2111a, and the size of the second portion 21122a sticking out from the bottom plate 2111a is similar to the size of the second electronic component 214a sticking out from the bottom plate 2111a.

The second server 22a includes a tray 221a, a circuit board 222a, a first electronic component 223a and a second electronic component 224a. The tray 221a includes a bottom plate 2211a and a front plate 2212a. The bottom plate 2211a has a supporting surface 22111a. The front plate 2212a includes a first portion 22121a and a second portion 22122a. The first portion 22121a and the second portion 22122a are both connected to the bottom plate 2211a. The tray 221a of the second server 22a is slidably disposed on the two rails 146. The supporting surface 22111a of the tray 221a faces the supporting surface 21111a of the tray 211a. In other words, the supporting surface 22111a of the tray 221a is opposite to the supporting surface 21111a of the tray 211a. The circuit board 222a of the second server 22a is disposed on the supporting surface 22111a of the bottom plate 2211a. The first electronic component 223a and the second electronic component 224a of the second server 22a are disposed on the circuit board 222a. The first electronic component 223a of the second server 22a protrudes from the circuit board 222a further than the second electronic component 224a of the second server 22a.

The first portion 22121a protrudes from the bottom plate 2211a further than the second portion 22122a. The first portion 22121a corresponds to the first electronic component 223a, and the second portion 22122a corresponds to the second electronic component 224a. Specifically, the size of the first portion 22121a sticking out from the bottom plate 2211a is similar to the size of the first electronic component 223a sticking out from the bottom plate 2211a, and the size of the second portion 22122a sticking out from the bottom plate 2211a is similar to the size of the second electronic component 224a sticking out from the bottom plate 2211a.

In more detail, the first electronic component 223a of the second server 22a is located above the second electronic component 214a of the first server 21a, and the second electronic component 224a of the second server 22a is located above the first electronic component 213a of the first server 21a. Thus, an orthogonal projection of the first electronic component 213a of the first server 21a on a reference plane P overlaps an orthogonal projection of the first electronic component 223a of the second server 22a on the reference plane P, wherein the reference plane P is a plane perpendicular to the first surface 141 and the front side 145. Therefore, the spaces above the shorter electronic components are properly used, making the first server 21a and the second server 22a compactly stacked. As a result, the chassis 10 is capable of accommodating more servers.

In addition, the shape of the front plate 2212a matches the shape of the front plate 2112a. In other words, the first portion 21121a, the second portion 22122a, the second portion 21122a and the first portion 22121a are able to fully cover the front side 145, which is beneficial to prevent dust from entering the accommodating space 14 and simplify the appearance of the server device 1a.

In this embodiment, the first server 21a and the second server 22a are point-symmetrical to each other, and an orthogonal projection of the first server 21a on the first surface 141 fully overlaps an orthogonal projection of the second server 22a on the first surface 141. Therefore, the configurations of the trays of the first server 21a and the second server 22a are the same, which is beneficial to reduce the development cost. However, the present disclosure is not limited thereto. In other embodiments, the first server 21a and the second server 22a can be arranged asymmetrical, but the orthogonal projection of the first server 21a on the first surface 141 should at least partially overlap the orthogonal projection of the second server 22a on the first surface 141.

More specifically, as shown in FIG. 2, the first server 21a includes a first edge 215a close to the second surface 142, and the second server 22a includes a second edge 225a close to the first surface 141. In this embodiment, the first edge 215a and the second edge 225a match each other, but the present disclosure is not limited thereto. In other embodiment, the first edge 215a and the second edge 225a may not match each other.

Figure 4:
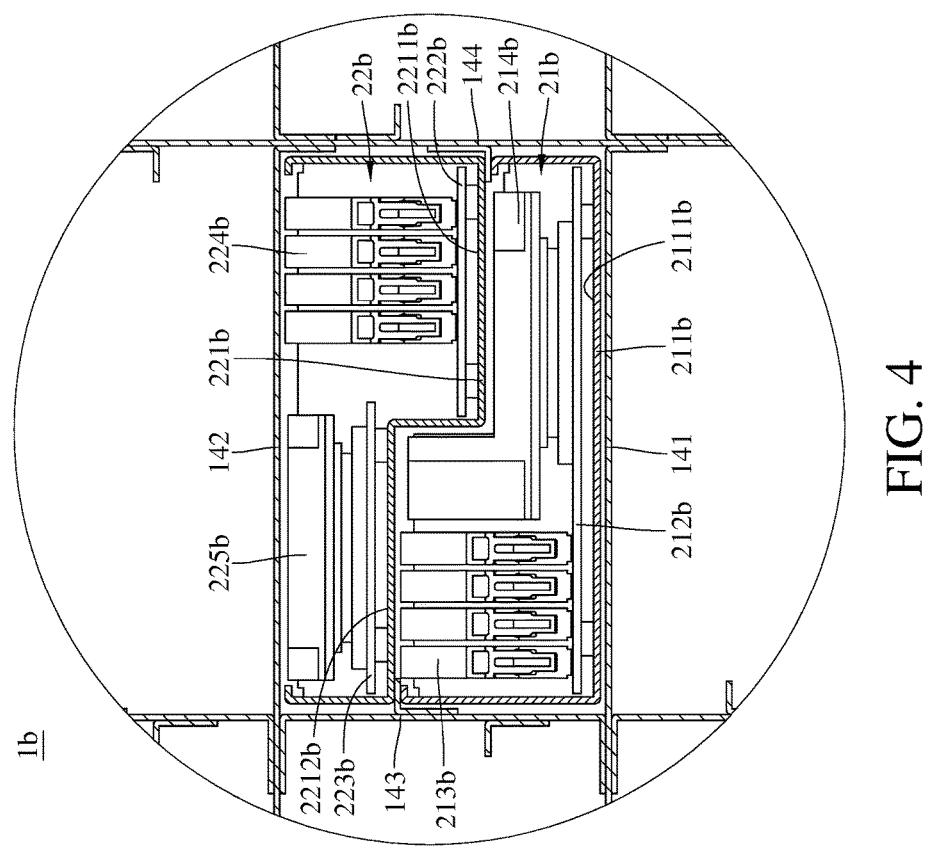
FIG. 4 is an enlarged cross-sectional view of a server device in accordance with another embodiment of the disclosure.

Please refer to FIG. 4. FIG. 4 is an enlarged cross-sectional view of a server device in accordance with another embodiment of the disclosure. This embodiment is similar with the embodiment as shown in FIG. 1, so only the difference between the two embodiments will be described. This embodiment provides a server device 1b. The first server 21b includes a first tray 211b, a first circuit board 212b, a first electronic component 213b, and a second electronic component 214b. The first tray 211b has a first supporting surface 2111b. The first circuit board 212b is disposed on the first supporting surface 2111b of the first tray 211b. The first electronic component 213b and the second electronic component 214b are disposed on the first circuit board 212b. The first electronic component 213b protrudes (sticks out) further than the second electronic component 214b. The second server 22b include a second tray 221b, a second circuit board 222b, a third circuit board 223b, a third electronic component 224b and a fourth electronic component 225b. The first tray 211b is closer to the first surface 141 than the second tray 221b, and the second tray 221b has a second supporting surface 2211b and a third supporting surface 2212b. The second supporting surface 2211b, the third supporting surface 2212b and the first supporting surface 2111b face the same direction, and the second supporting surface 2211b is closer to the first surface 141 than the third supporting surface 2212b. The second circuit board 222b and the third circuit board 223b are respectively disposed on the second supporting surface 2211b and the third supporting surface 2212b of the second tray 221b. The third electronic component 224b is disposed on the second circuit board 222b, the fourth electronic component 225b is disposed on the third circuit board 223b, and the third electronic component 224b protrudes (i.e., sticks out) further than the fourth electronic component 225b.

Figure 5:
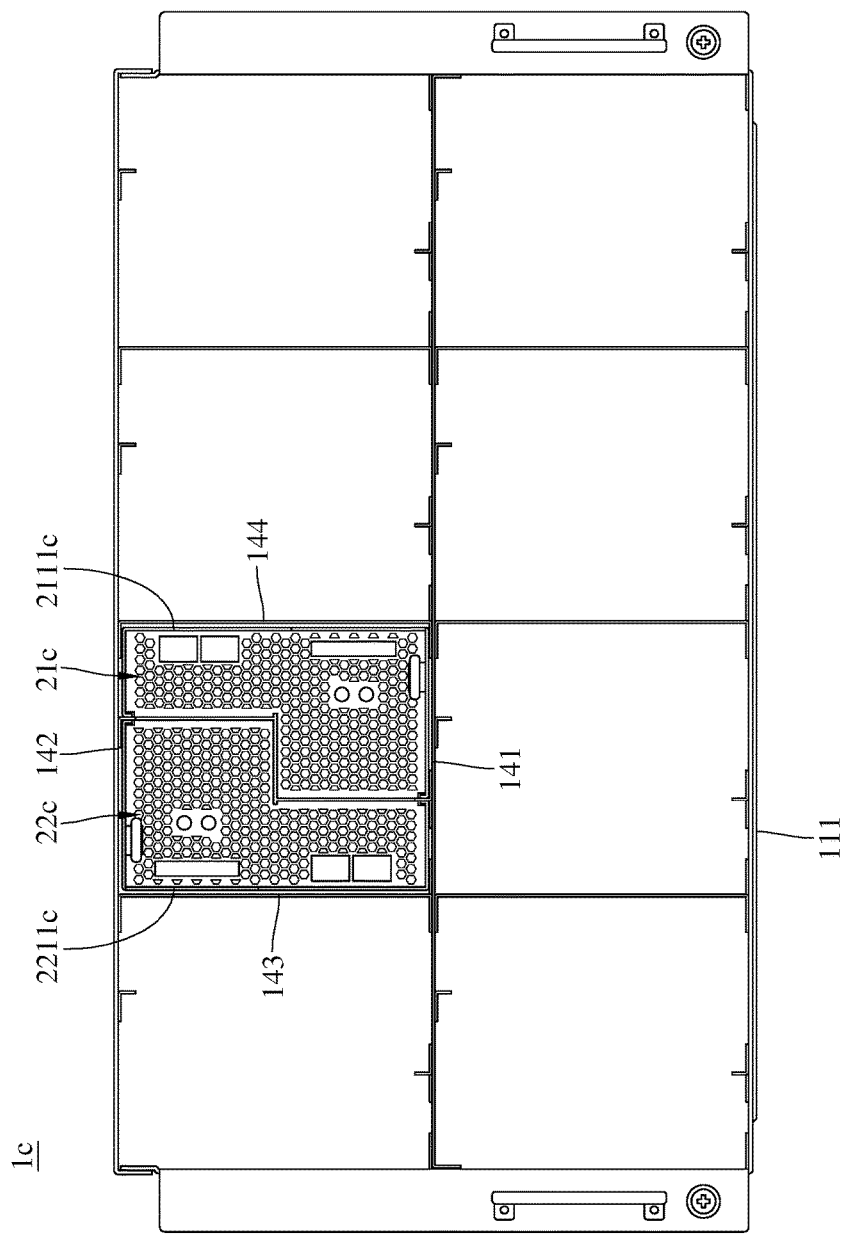
FIG. 5 is a front view of a server device in accordance with yet another embodiment of the disclosure.

In addition, in the embodiment in FIG. 1, the first server 21a and the second server 22a are disposed horizontally, but the present disclosure is not limited thereto. Please refer to FIG. 5. FIG. 5 is a front view of a server device in accordance with yet another embodiment of the disclosure. This embodiment is similar with the embodiment as shown in FIG. 1, so only the difference between the two embodiments will be described. In this embodiment, a first server 21c and a second server 22c of a server device 1c are disposed vertically. In other words, the first surface 141 is perpendicular to the supporting surfaces 2111c and 2211c.

Figure 6:
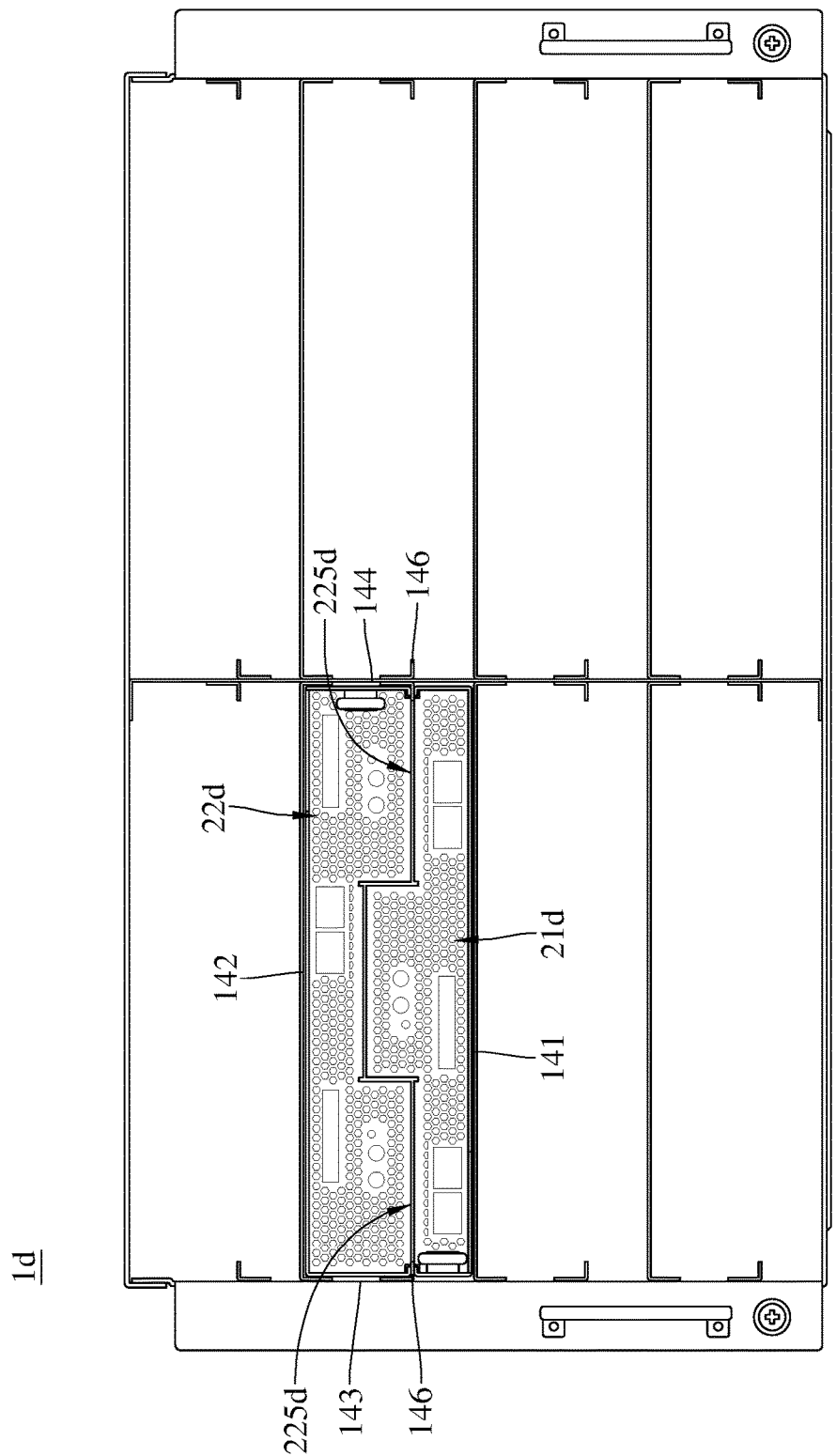
FIG. 6 is a front view of a server device in accordance with yet still another embodiment of the disclosure.

Further, in the embodiment in FIG. 1, the distances between the two ends of the second edge 225a and the first surface 141 are different so that the distances between the rails 146 and the first surface 141 are different, but the present disclosure is not limited thereto. Please refer to FIG. 6. FIG. 6 is a front view of a server device in accordance with yet still another embodiment of the disclosure. This embodiment is similar with the embodiment as shown in FIG. 1, so only the difference between the two embodiments will be described. In this embodiment, the distances between two ends of a second edge 225d of a server device 1d and the first surface 141 are the same, so the distances between the rails 146 and the first surface 141 are the same.

According to the server device as discussed above, the orthogonal projection of the taller electronic component of the first server on the third surface partially overlaps the orthogonal projection of the taller electronic component of the second server on the third surface. In other words, the taller electronic component of the second server is located above the shorter electronic component of the first server, and the shorter electronic component of the second server is located above the taller electronic component of the first server. Thus, the first server and the second server are in a staggered arrangement, and the spaces above the shorter electronic components are properly used.

Furthermore, the first edge matches the second edge, which is beneficial to fully utilize the accommodating space of the chassis. Hence, the amount of servers in each stack is increased, thereby improving the overall ability of the server device.

Moreover, the first server and the second server are point-symmetrical to each other. In other words, the configurations of the trays in the server device are the same, which is beneficial to reduce the development cost.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A server device, comprising:
   a chassis, having at least one accommodating space, at least one first surface, at least one second surface, at least one opening and at least one front side, the at least one first surface and the at least one second surface facing each other and respectively located at two opposite sides of the at least one accommodating space, the at least one opening located at the at least one front side and connected to the at least one accommodating space; and
   at least one server assembly, slidably disposed in the at least one accommodating space from the at least one opening, the at least one server assembly comprising a first server and a second server, and the first server closer to the at least one first surface than the second server;
   wherein both the at least one first surface and the at least one front side are orthogonal to a reference plane, and an orthogonal projection of the first server on the reference plane partially overlaps an orthogonal projection of the second server on the reference plane;
   wherein the first server and the second server both have a tray, a circuit board, a first electronic component and a second electronic component, each of the trays has a supporting surface, the two supporting surfaces face each other, the circuit boards are respectively disposed on the supporting surfaces, the first electronic components are respectively disposed on the circuit boards, the second electronic components are respectively disposed on the circuit boards, the first electronic component protrudes further from the circuit board than the second electronic component, an orthogonal projection of the first electronic component of the first server on the reference plane partially overlaps an orthogonal projection of the first electronic component of the second server on the reference plane;
   wherein each of the trays has a bottom plate and a front plate, each of the front plate comprises a first portion and a second portion, both the first portion and the second portion are connected to the bottom plate, the first portion protrudes further from the circuit board than the second portion, the first portion corresponds to the first electronic component, and the second portion corresponds to the second electronic component.

2. The server device according to claim 1, wherein an orthogonal projection of the first server on the at least one first surface partially overlaps an orthogonal projection of the second server on the at least one first surface.

3. The server device according to claim 2, wherein an orthogonal projection of the first server on the at least one first surface fully overlaps an orthogonal projection of the second server on the first surface.

4. The server device according to claim 1, wherein the chassis further comprises a bottom surface, the bottom surface is parallel to the supporting surface of the first server and the supporting surface of the second server.

5. The server device according to claim 1, wherein the chassis further comprises a bottom surface, the bottom surface is perpendicular to the supporting surface of the first server and the supporting surface of the second server.

6. The server device according to claim 1, wherein the chassis further has at least one third surface, at least one fourth surface and two rails, the at least one third surface and the at least one fourth surface face each other, the at least one third surface and the at least one fourth surface are located at another two opposite sides of the at least one accommodating space, the at least one third surface and the at least one fourth surface are located between the at least one first surface and the at least one second surface, the rails are respectively located on the at least one third surface and the at least one fourth surface, the tray of the first server or the tray of the second server is slidably disposed on the rails.

7. The server device according to claim 6, wherein a distance between one of the rails and the at least one first surface is equal to a distance between the other rail and the at least one first surface.

8. The server device according to claim 6, wherein a distance between one of the rails and the at least one first surface is different from a distance between the other rail and the at least one first surface.

9. The server device according to claim 1, wherein the first server has a first tray, a first circuit board, a first electronic component and a second electronic component, the first tray has a first supporting surface, the first circuit board is disposed on the first supporting surface of the first tray, both the first electronic component and the second electronic component are disposed on the first circuit board, the first electronic component protrudes further form the first circuit board than the second electronic component, the second server has a second tray, a second circuit board, a third circuit board, a third electronic component and a fourth electronic component, the first tray is closer to the at least one first surface than the second tray, the second tray has a second supporting surface and a third supporting surface, the second supporting surface and the third supporting surface face the same direction, the second supporting surface is closer to the at least one first surface than the th, the second circuit board and the third circuit board are respectively disposed on the second supporting surface and the third supporting surface, the third electronic element is disposed on the second circuit board, the fourth electronic element is disposed on the third circuit board, and the third electronic elements protrudes further from the second circuit board than the fourth electronic element protrudes from the third circuit board.

10. The server device according to claim 9, wherein the chassis further has at least one third surface, at least one fourth surface and two rails, the at least one third surface and the at least one fourth surface face each other, the at least one third surface and the at least one fourth surface are located at another two opposite sides of the at least one accommodating space, the at least one third surface and the at least one fourth surface are located between the at least one first surface and the at least one second surface, the rails are respectively located on the at least one third surface and the at least one fourth surface, the first tray of the first server or the second tray of the second server is slidably disposed on the rails.

11. The server device according to claim 10, wherein a distance between one of the rails and the at least one first surface is equal to a distance between the other rail and the at least one first surface.

12. The server device according to claim 10, wherein a distance between one of the rails and the at least one first surface is different from a distance between the other rail and the at least one first surface.

13. The server device according to claim 1, wherein the first server has a first edge, which is close to the at least one second surface, the second server has a second edge, which is close to the at least one first surface, and the first edge matches the second edge.

14. The server device according to claim 13, wherein the first server and the second server are point-symmetrical with each other.

* * * * *